United States Patent
Tewksbury

[11] 4,017,849
[45] Apr. 12, 1977

[54] APPARATUS FOR ANALOG TO DIGITAL CONVERSION

[75] Inventor: Stuart Keene Tewksbury, Middletown, N.J.

[73] Assignee: Bell Telephone Laboratories, Incorporated, Murray Hill, N.J.

[22] Filed: Aug. 28, 1975

[21] Appl. No.: 608,524

[52] U.S. Cl. .................... 340/347 AD; 325/38 B
[51] Int. Cl.² .................................... H03K 13/22
[58] Field of Search ............ 325/38 B; 332/11 D; 340/347 AD

[56] References Cited

UNITED STATES PATENTS

| | | | |
|---|---|---|---|
| 2,916,553 | 12/1959 | Crowley | 325/38 B |
| 3,305,854 | 2/1967 | Witt | 340/347 AD |

*Primary Examiner*—Charles D. Miller
*Attorney, Agent, or Firm*—Barry H. Freedman

[57] ABSTRACT

An input analog signal is converted to a digital output signal by an oversampled predictive DPCM coder which includes an $n$ stage delay line in the feedback loop. The $n$ delay line outputs are weighted by coefficients $a_1 \ldots a_n$ selected according to the relationship $$a_i = \frac{(-1)^{i+1}(n!)}{(n-i)!i!}, i = 1,2\ldots n,$$

and then summed. Alternatively, the feedback loop may comprise a chain of $n$ integrators arranged so that the signal fed back to the comparator is the sum of single, double, triple . . . $n$ order integration. By so doing, the coder attenuates the signal power at the quantizer input while the attenuator coefficients are independent of the input signal statistics.

A similar technique may also be applied in an oversampled error feedback coder, which includes a feedback loop having an $n$ stage delay line. Here again, the delay line outputs are weighted in accordance with the above relationship. Alternatively, a chain of $n$ integrators may be used in the coder input, and an identical chain employed in the feedback loop. By so doing, the coder attenuates the coding noise power in the signal band while the coder design is rendered independent of the quantizing error statistics.

7 Claims, 10 Drawing Figures

APPARATUS FOR ANALOG TO DIGITAL CONVERSION

BACKGROUND OF THE INVENTION

1. Field of the Invention

The present invention relates generally to conversion of analog signals to digital signals and, more particularly to both predictive and error feedback coders that sample the analog signal at generally high rates and provide a differential pulse code modulation (DPCM) output.

2. Description of the Prior Art

Sophisticated digital integrated circuit technologies have made digital signal processors which perform a variety of functions a practical alternative to conventional analog systems. The trend toward digital processing is accompanied by many advantages, including precisely predictable performance, the ability to share hardware over several separate channels without inter-channel distortion, and the flexibility of programming one processor to perform a variety of functions.

Since digital processors must typically interface with continuous signals, analog/digital and digital/analog converters thus become increasingly important system components. Many such converters have been developed, including predictive coders which reduce the dynamic range of the input signal applied to the quantizer within the coder, or error feedback coders which shape the spectral distribution of the quantizing error so as to reduce in-band noise. Both types of coders may make use of tapped delay lines in the feedback path, with the n outputs of the delay line being fed through n separate attenuators having coefficients $a_1 \ldots a_n$, and then summed. With this arrangement, various techniques are available for choosing appropriate attenuator coefficients. In each technique, it is desirable to minimize the number of required quantization levels, so that the number of bits needed to adequately represent the signal being encoded is reduced. Certain of the prior art techniques for coefficient optimization have been developed primarily for transmission systems. However, in such systems, oversampling, as desired in the present invention, cannot be used, since it results in a undesirably high transmission rate. Accordingly, one subject of the present invention is to optimize the coefficient selection technique in cases where oversampling is acceptable.

Other prior art techniques known in the field of video transmission have utilized moderate oversampling in conjunction with single or double integration feedback networks. However, these systems have also been limited in the degree of quantizer simplification achieved. Accordingly, another object of the present invention is to retain the signal independent feedback network as in video coders, while achieving a much greater reduction in the number of required quantization levels.

SUMMARY OF THE INVENTION

Each of the foergoing and additional objects are achieved in accordance with the principles of the instant invention by providing, in both predictive and error feedback oversampled coders which include delay lines having n output stages, a series of $n$ attenuators having coefficients selected according to the relationship $$a_i = \frac{(-1)^{i+1}(n!)}{(n-i)! \, i!}, i = 1,2 \ldots n.$$

Alternatively, in the case of predictive coders, the feedback loop may include a chain of $n$ integrators arranged so that the signal fed back to the comparator is the sum of single, double, triple ... $n$ order integration. In the case of error feedback coders, serial chains of $n$ integrators may be employed both in the coder input line, and in the feedback loop. By virtue of the advantageous coder arrangement of the present invention, the number of levels required in the quantizer is significantly reduced, while the feedback network is maintained independent of the input signal.

BRIEF DESCRIPTION OF THE DRAWING

The invention will be more clearly understood from a consideration of the following detailed description when read in light of the accompanying drawing in which.

DETAILED DESCRIPTION

Figure 1:
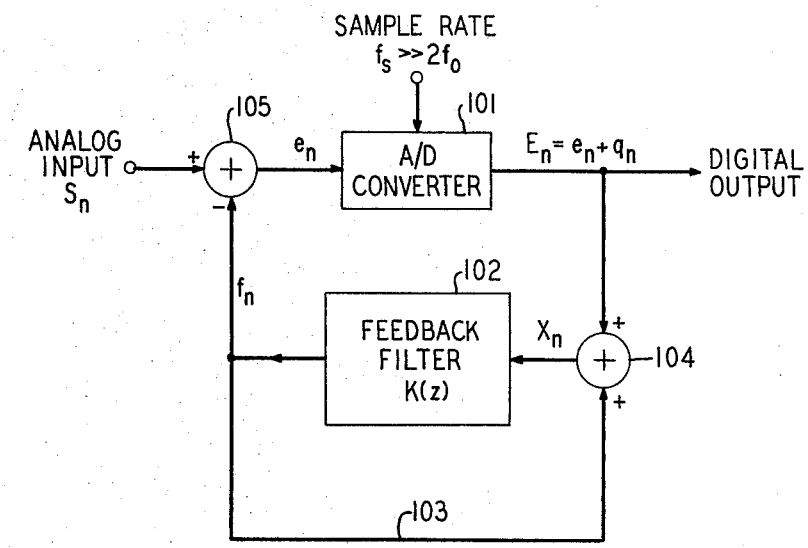
FIG. 1 is a block diagram of a prior art predictive coder.

As shown in FIG. 1, a prior art predictive coder typically includes a forward loop containing an analog to digital (A/D) converter such as quantizer 101 and a feedback loop which contains a feedback filter 102, to be discussed in more detail hereinafter. The output of feedback filter 102 is fed back to its input via line 103 and additive circuit 104, which combines the output with the output of quantizer 101. The feedback filter 102 output is also supplied to subtractive circuit 105, thus completing the feedback circuit to the quantizer.

In operation, the quantizer 101 input signal $e_n$ is the difference between the input signal $s_n$ and the output $f_n$ of filter 102. Quantizer 101, assumed to have equal quantization levels, has an output $E_n$ which approximates $e_n$ by the nearest discrete quantization level, i.e., $$E_n = e_n + q_n \tag{1}$$

where $q_n$ is the quantization error. From the above relationships, it is seen that the output of circuit 104 is given by:

$$X_n = E_n + f_n \qquad (2)$$

and the output of circuit 105 is given by:

$$e_n = s_n - f_n \qquad (3)$$

so that, from equations 1, 2 and 3:

$$X_n = (e_n + f_n) + q_n = s_n + q_n. \qquad (4)$$

If the characteristics of feedback filter 102 are appropriately chosen, its output $f_n$ is a good prediction of the next input signal sample $s_n$. As a result, $e_n$ which represents the extrapolation error of the coder, is quantized in quantizer 101, instead of the input signal $s_n$, as would be the case in an A/D converter not using predictive feedback. Specifically, if $s_p$ and $e_p$ represent the peak values of $s_n$ and $e_n$, respectively, and it is assumed that $s_p$ and $e_p$ are proportional to their means square values $\sigma_s^2$ and $\sigma_e^2$, the number of quantization levels required in quantizer 101 is reduced by a factor $$\theta = \sqrt{\sigma_e^2} / \sqrt{\sigma_s^2} \qquad (5)$$

relative to the number required in nonpredictive coders.

Figure 2:
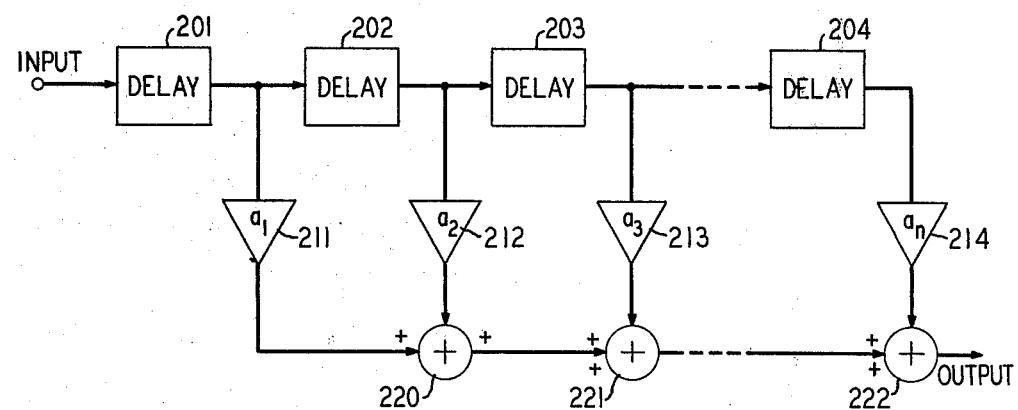
FIG. 2 is a block diagram of one realization of the feedback filter of FIG. 1.

One known manner of arranging filter 102 to produce the above results is the use of a delay line having a series of $n$ stages such as stages 201, 202, 203 and 204 as shown in FIG. 2. Connected to the output of each stage 201 through 204 are $n$ attenuators such as attenuators 211, 212, 213 and 214 each having a coefficient $a_1, a_2, a_3 \ldots a_n$. The outputs of attenuators 211 through 214 are summed in additive circuits 220, 221, 222 so that the Z-transform K(Z) of the entire filter is given by:

$$K(Z) = \sum_{i=1}^{n} a_i Z^{-i}. \qquad (6)$$

When the delay line arrangement of FIG. 2 is used in the coder of FIG. 1, the mean square value of the quantizer input signal, neglecting quantizing errors, is given by:

$$\sigma_e^2 = \langle e_n^2 \rangle = \psi_0 + \sum_{m=1}^{N} \sum_{n=1}^{N} a_m a_n \psi_{m-n} - 2 \sum_{m=1}^{N} a_m \psi_m, \qquad (7)$$

wherein $\psi_m$, the autocorrelation function of the input signal, is given by:

$$\psi_m = \langle s_n s_{n+m} \rangle \triangleq \lim_{K \to \infty} \frac{1}{2K+1} \sum_{l=-K}^{K} (s_{n+l+m}) \cdot (s_{n+l}). \qquad (8)$$

The standard prior art procedure for minimizing $\sigma_e^2$ is to simultaneously solve the N linear equations:

$$\frac{\delta \sigma_e^2}{\delta a_i} = 0 \text{ for } i = 1, 2 \ldots N. \qquad (9)$$

While solution of equation (9) yields the filter coefficients $a_i$, the coefficients are functions of and depend upon the input sample correlations $\psi_e$. However, such dependence is not desirable in many applications, since the input signals are nonstationary. Accordingly, an alternative filter design approach is needed.

In accordance with the present invention, signal independent attenuator coefficients $a_i$ are computed according to the relationship $$a_i = \frac{(-1)^{i-1} (N!)}{(N-i)! \, i!}, \, i = 1, 2 \ldots N. \qquad (10)$$

This relationship is arrived at by first considering that the input sample correlations $\psi_e$ and the two-sided power spectral density $G_s(f)$ of the input signal are related by:

$$\psi_e = \int_{-f_0}^{f_0} G_s(f) \exp(-j 2\pi l f/f_s) df \qquad (11)$$

where $f_s$ is the sample rate and $f_0$ is the input signal bandwidth. Using equation (11) in equation (7) $\sigma_e^2$ may be expanded as a power series in $(f_0/f_s)^2$, since it is assumed that $f_s \gg 2f_0$ due to oversampling. Such expansion yields the general form $$\sigma_e^2 = \sum_{l=0}^{\infty} \beta_l (a_j, N) \cdot (f_0/f_s)^{2l} \cdot \int_{-f_0}^{f_0} G_s(f) (f/f_0)^{2l} df, \qquad (12)$$

where the $\beta_l$ depend only on the filter coefficients and N. By choosing the filter coefficients in accordance with equation (10), $\beta_l = 0$ for $l \leq N-1$ in equation (12), leaving the lowest order nonvanishing term in equation (12) as $$\sigma_e^2 \approx (2\pi f_0/f_s)^{2N} \int_{-f_0}^{f_0} G_s(f) (f/f_0)^{2N} df. \qquad (13)$$

Figure 3:
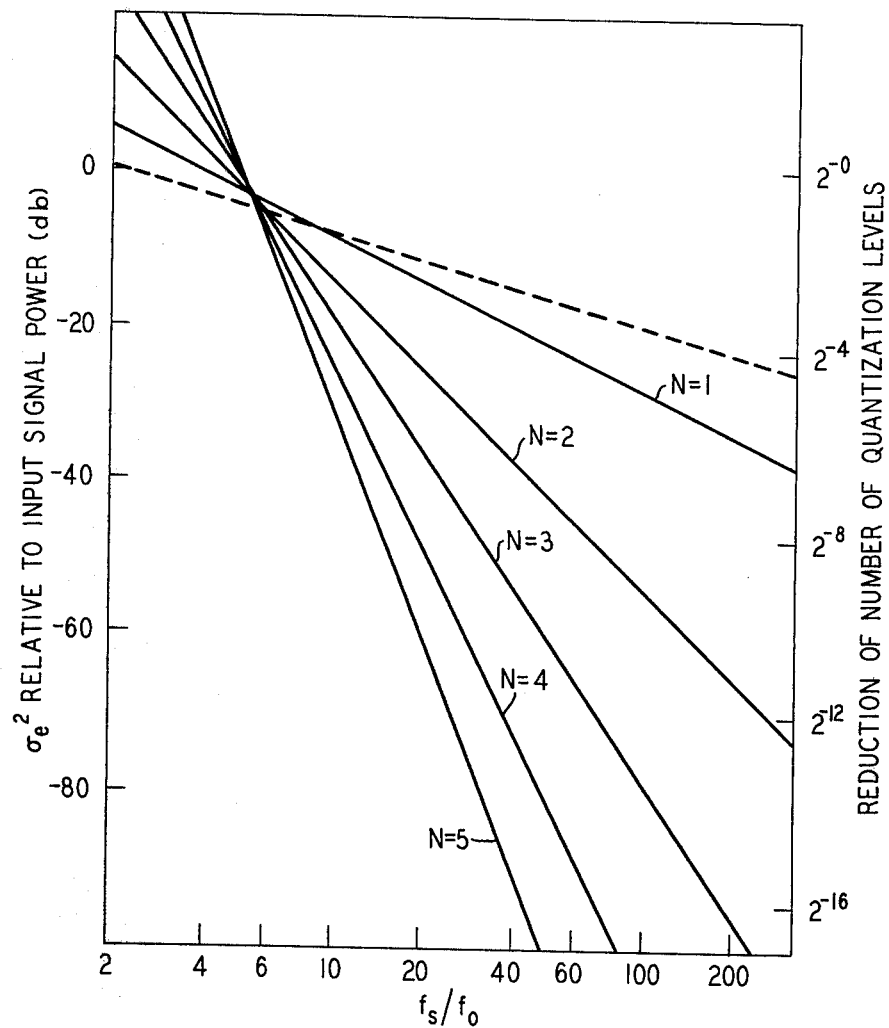
FIG. 3 is a graph of both the means square error signal and the reduction in the number of required quantizer levels in the coder of FIGS. 1 and 2, when the coefficients in accordance with the invention are used.

Combining equations (13) and (5), it is seen that by using the coefficients selected in accordance with equation (10), the number of quantization levels required is significantly reduced. For example, as shown in FIG. 3, for a three stage delay line (N=3) and for a sampling rate $f_s$ of 20 times that of the input signal bandwidth $f_0$, the number of quantization levels required in quantizer 101 is reduced by more than a factor of 64, as compared to the case of a quantizer without feedback. For the same ratio of $f_s/f_0$, the reduction of levels for 4 and 5 stage delay lines are greater than 256 and 512, respectively. Alternatively stated, it is seen from FIG. 3 that by the advantageous choice of attenuator coefficients in accordance with the present invention, $\sigma_e^2$ decreases by 6N dB per octave increase in sampling rate, for an N stage delay line; quantization levels are accordingly decreased by a factor of 2N for each doubling of the sampling rate.

Using the results of equation (10) in equation (6), it will be seen that, in Z transform notation, the transfer characteristic of filter 102 is given by:

$$K(Z) = 1 - (1 - Z^{-1})^N. \qquad (14)$$

Also, it will be seen that the transfer function T(Z) between the output and input of filter 102, taking into account feedback line 103, is:

$$T(Z) = \frac{K(Z)}{1 - K(Z)}. \quad (15)$$

Substituting equation (14) in (15), the output/input transfer function is thus:

$$T(Z) = \frac{1 - (1 - Z^{-1})^N}{1 - [1 - (1 - Z^{-1})^N]} = \frac{1 - (1 - Z^{-1})^N}{(1 - Z^{-1})^N}. \quad (16)$$

Figure 4:
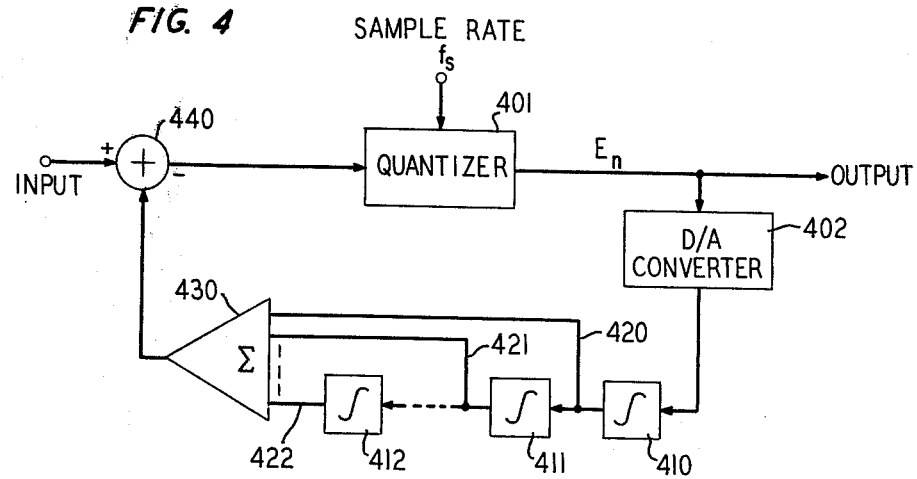
FIG. 4 is a block diagram of a predictive coder constructed in accordance with the principles of the present invention.

Since equation (16) may be written in the form $$T(Z) = Z^{-1} \sum_{j=1}^{N} \frac{1}{(1 - Z^{-1})^j} \quad (17)$$

and since the transfer function of a single integrator is given by $$\frac{1}{(1 - Z^{-1})},$$

a coder using analog prediction rather than the predictive filter of FIG. 2, may be constructed in accordance with the invention as shown in FIG. 4. As before, the forward loop contains a quantizer 401 which is arranged to sample the analog input signal applied thereto at a rate $f_s$ much greater than the input signal bandwidth $f_o$, and to provide at its output a digital signal $E_n$, representative of said input signal. The digital signal is fed, in the feedback loop, first to a digital to analog converter 402, and then to a serial chain of M analog integrators, such as integrators 410, 411, and 412. The outputs of integrators 410, 411, and 412 are connected via lines 420, 421 and 422 to an adding circuit 430, such that the adder output consists of the sum of single, double, triple . . . M order integration. The feedback loop is completed by connecting the output of adding circuit 430, which output is a good prediction of the input signal, to the negative input terminal of a comparator or differencing circuit 440, the positive input to which is the analog input signal.

Inspection of the circuit of FIG. 4 reveals that the transfer function between the output of converter 402 and the output of adder 430 is given, as desired, by equation (17). The initial $Z^{-1}$ term is built into the time response of the integrators. The use of D/A converter 402 prior to the integrators 410 through 412 in the feedback loop of course requires that the integrators be designed to operate on analog signals. This arrangement is, however, preferred over the use of digital integrators followed by a digital to analog conversion, since a very high degree of converter precision would then be needed. However, when the coder is configured as shown in FIG. 4, converter 402 may be constructed with a degree of precision only matching that of quantizer 401, which as explained previously, is advantageously quite simple.

Figure 5:
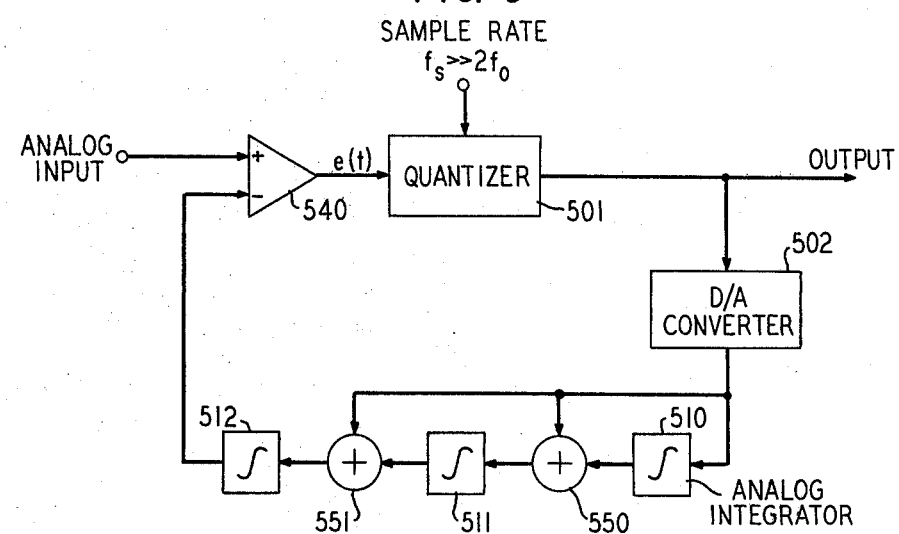
FIG. 5 is an alternative arrangement for the coder of FIG. 4.

An alternative arrangement to the coder of FIG. 4 is shown in FIG. 5. In this embodiment, quantizer 501, converter 502, and differencing circuit 540 are all equivalent to their FIG. 4 counterparts. Adder circuits 550 and 551 are disposed after each integrator 510 and 511 in the serial chain of M integrators, with the exception only of the last integrator 512. The output of converter 502 is simultaneously applied to the input of the first integrator 510 in the chain, as well as to each adder circuit 550 and 551. As will be seen by inspection, the output of the last integrator 512 is the sum of first, second, third . . . M order integration, as was the case for the coder of FIG. 4.

Figure 6:
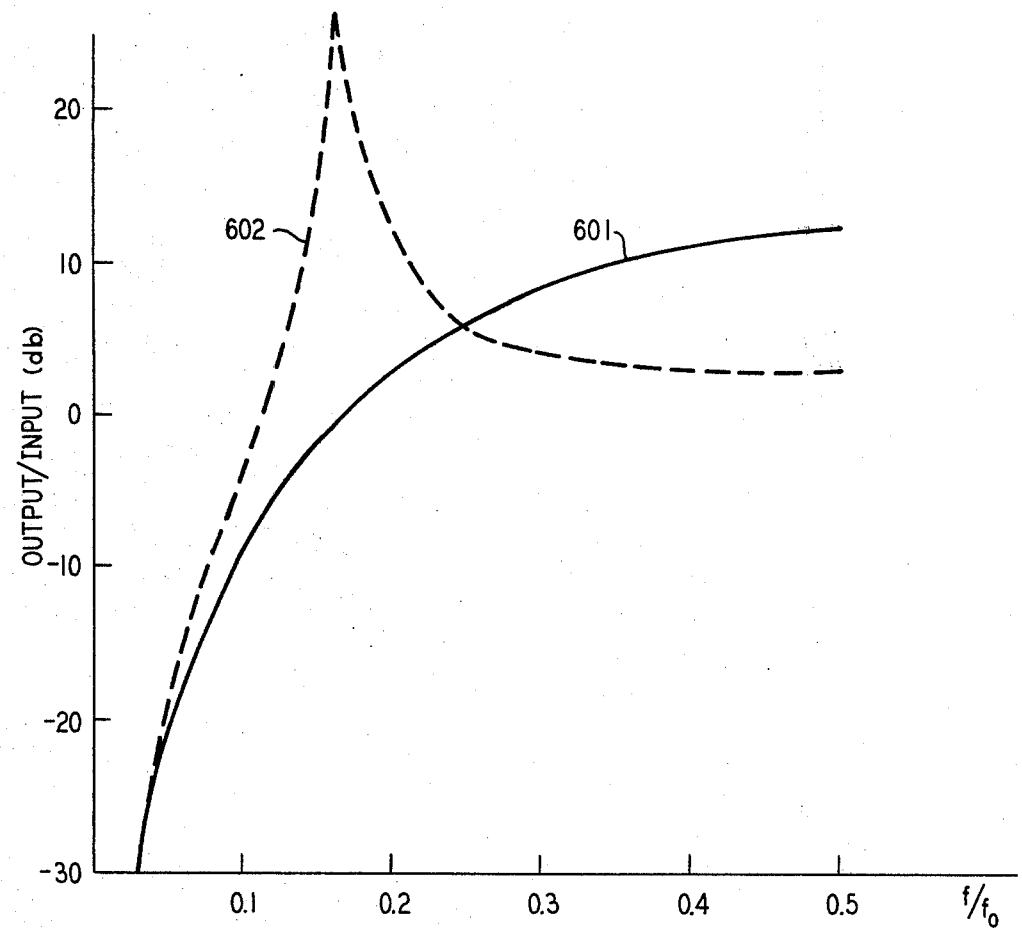
FIG. 6 is a graph of the transfer function of the coders of FIGS. 4 and 5 as a function of frequency.

The advantages of the predictive coders of FIGS. 4 and 5 may be still better appreciated by reference to the graph of FIG. 6, in which the coder transfer function (the ratio of the coder output to input, in dB is plotted as a function of the ratio $f/f_s$ of the input signal frequency to the sampling frequency. For a second order coder in accordance with the invention, i.e., a coder having a feedback loop in which the output is the sum of single plus double integration, curve 601 shows the coder transfer function, which is given by:

$$|h(f)|^2 = 4(1 - \cos 2\pi f/f_s)^2. \quad (18)$$

By way of comparison, curve 602 shows the transfer function of a prior art coder having two serially connected integrators in the feedback loop. The transfer function in this case is given by:

$$|h(f)|^2 = \frac{4(1 - \cos 2\pi f/f_s)^2}{3 - 4\cos 2\pi f/f_s + 2\cos 4\pi f/f_s}. \quad (19)$$

As can be seen from the graph, superior attenuation is provided by the coders in accordance with the invention, in the ranges where $f/f_s \lesssim 0.2$, i.e., where there is oversampling. This is true notwithstanding the use, in prior art apparatus, of intentionally "leaky" integrators, which tend to reduce but not eliminate entirely the peak at the transfer function pole.

Figure 7:
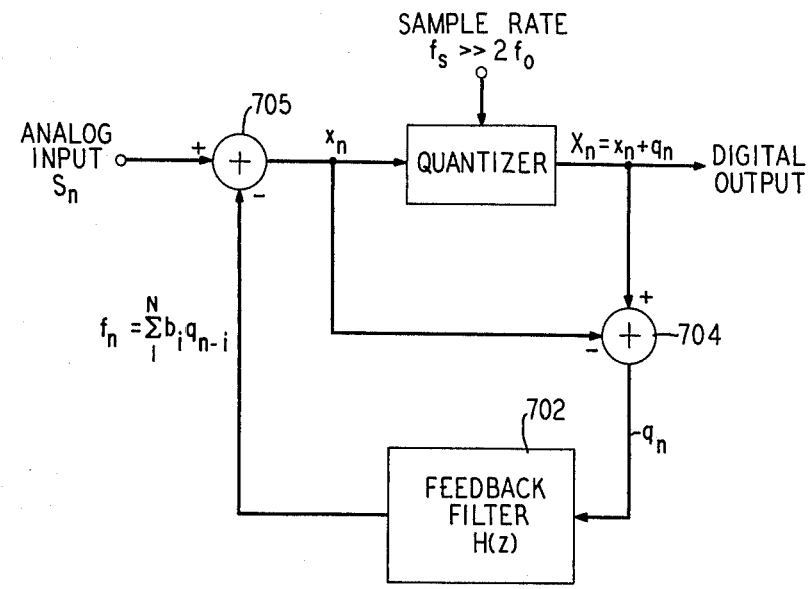
FIG. 7 is a block diagram of a prior art error feedback coder.

The invention described above with respect to predictive coders is also applicable to error feedback coders, such as prior art coders of the type depicted in FIG. 7. As shown, the forward loop includes an A/D converter or quantizer 701, and the feedback loop contains a feedback filter 702. However, in this arrangement, the input to quantizer 701, which is a composite signal $x_n$ comprising the difference between the input signal $s_n$ and a feedback signal $f_n$, is subtracted from the output thereof by a differencing circuit 704, to form a quantizing error signal $q_n$. The error signal $q_n$ is filtered by filter 702 to form the aforesaid feedback signal, which is then subtracted from the input signal in a second differencing circuit 705. In this arrangement, assuming that filter 702 is an N tap delay line with coefficients $a_1 \ldots a_n$, the quantizer 701 output signal $X_n$ is the nearest discrete quantization level to the quantizer input sample $x_n$, wherein $$X_n = S_n - \sum_{i=1}^{N} a_i q_{n-i} + q_n \quad (20)$$

and $$X_n = x_n + q_n. \quad (21)$$

Since, as stated previously, equation (6) is the transfer function of filter 702, equation (20) may be written in Z-transform rotation as $$X(Z) = S(Z) + [1 - H(Z)] \cdot q(Z). \quad (22)$$

Equation (22) shows that the spectral density of the quantizing noise is shaped by the response of the Z-transform $1 - H(Z)$, and thus that appropriate choice of the coefficients $a_i$, assuming $f_s \gg f_o$, will minimize the amount of in-band noise power by placing most of the noise out-of-band where it may be eliminated using a digital low pass filter. By so doing, the quantization level separation can be increased relative to that of an A/D converter without feedback; this, in turn, permits a desired decrease in the number of quantization levels required.

Minimization of noise in the band between $-f_o$ and $f_o$ is generally accomplished, using prior art techniques, by first recognizing that the noise power $Q(f_o)$ is given by $$Q(f_o) = \int_{-f_o}^{f_o} |h(f)|^2 G_q(f) df \qquad (23)$$

where $G_q(f)$ is the two-sided power density function of the individual quantizing errors $q_n$, which, it is assumed, are not correlated with the input samples, and where $$h(f) = 1 - \sum_{n=1}^{N} a_n \exp(j2\pi n f/f_s). \qquad (24)$$

Expanding equation (23) using equation (24) gives $$Q(f_o) = \beta_o + \sum_{n=1}^{N} \sum_{m=1}^{N} a_n a_m \beta_{n-m} - 2 \sum_{n=1}^{N} a_n \beta_n \qquad (25)$$

where $$\beta_k = \int_{-f_o}^{f_o} G_q(f) \exp(2\pi k f/f_s) df. \qquad (26)$$

Filter coefficients which minimize $Q(f_o)$ may then be obtained by solving the simultaneous equations $$\delta Q(f_o)/\delta a_k = 0 \qquad K = 1,2\ldots N, \qquad (27)$$

which yields a solution $$B = \tau^{-1} \cdot \gamma \qquad (28)$$

where B and $\gamma$ are vectors with components $a_k$ and $\beta_k$, respectively, and $\tau$ is an NXM matrix with components $$\tau_{j,k} = \beta_{j-k}. \qquad (29)$$

This solution, however, is often undersirable in that the coefficients obtained from equation (29) depend on the noise spectral density $G_q(f)$.

In accordance with the invention, spectrum independent coefficients are obtained in a manner similar to that described above for predictive coders, namely by expanding equation (25) as a power series in $(f_o/f_s)^2$ and choosing the $a_k$ such that coefficients of terms up to the $N^{th}$ term vanish. The resulting coefficients are again given by $$a_k = \frac{(-1)^{k+1} N!}{(N-k)! k!} \qquad (30)$$

and the transfer function of an N-tap delay line with coefficients according to equation (30) is again given by equation (14).

Figure 8:
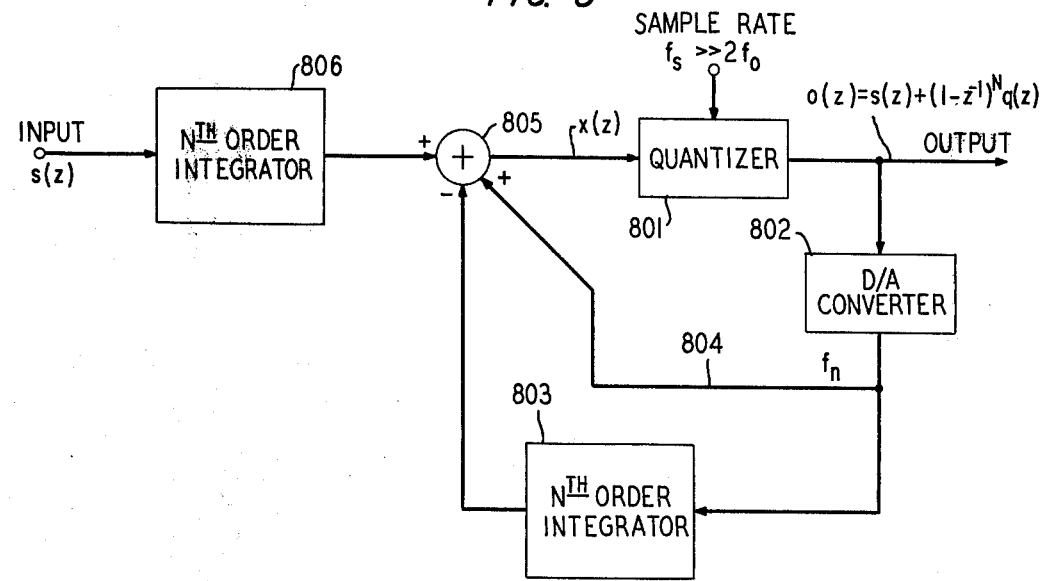
FIG. 8 is a block diagram of an error feedback coder constructed in accordance with the principles of the instant invention.
Figure 9:
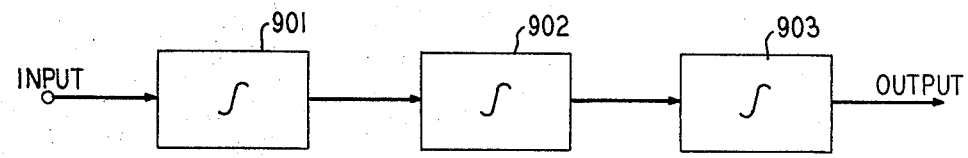
FIG. 9 is a block diagram of a third order integrator that may be used in the coder of FIG. 8.

Realization of an error feedback pulse code modulation encoder utilizing analog integrators in lieu of an N tap delay line in the feedback loop is accomplished as shown in FIG. 8. As in FIG. 7, the forward loop includes a quantizer 801 which is arranged to sample the composite signal $X(Z)$ applied thereto at a rate $f_s$ greater than the Nyquist rate $2f_o$. However, the input signal is applied to quantizer 801 via a first $N^{th}$ order integrator 806, followed by a combinatorial circuit 805. Circuit 805 is arranged to algebraically combine (i.e., add or subtract in a desired manner) the input signals applied thereto. In the feedback loop, the output of quantizer 801 is applied to a digital to analog converter 802, which may be constructed with the same simplicity as quantizer 801, to form a direct feedback signal $f_n$. This signal is applied via line 804 to a positive input of circuit 805, and also to the input of a second $N^{th}$ order integrator 803, the output of which is applied to a negative input of circuit 805. $N^{th}$ order integrators 803 and 806 are simply serial chains of N analog integrators. For example, a third order integrator would simply include integrators 901, 902 and 903, as shown in FIG. 9.

The equivalence between the coders of FIGS. 7 and 8 when the former advantageously utilizes the coefficients of equation (30) may be appreciated by rewriting equation (22) as $$X(Z) = S(Z) + G(Z) \cdot q(Z) \qquad (31)$$

wherein $$G(Z) = 1 - H(Z). \qquad (32)$$

Bearing in mind that the transfer function of a multi-stage delay line with coefficients in accordance with equation (30) is $$H(Z) = 1 - (1 - Z^{-1})^N, \qquad (14)$$

then $$G(Z) = (1 - Z^{-1})^N.$$

Accordingly, the transfer function of $N^{th}$ order integrators 803 and 806 is given by $1/G(Z)$, since, as stated previously, the transfer function of an individual integrator is $1/(1-Z^{-1})$. Applying the foregoing to the coder FIG. 8, it will be seen that for an input signal $S(Z)$, and an output signal $X(Z)$, the output of integrator 806 is given by $S(Z)/G(Z)$, the output of integrator 803 is given by $X(Z)/G(Z)$, and the signal on line 804 is the output signal $X(Z)$. The output of circuit 805 is thus $$\frac{S(Z)}{G(Z)} + X(Z) - \frac{X(Z)}{G(Z)}, \qquad (33)$$

and the output of quantizer 801 is thus $$X(Z) = \frac{S(Z)}{G(Z)} + X(Z) - \frac{X(Z)}{G(Z)} + q(Z). \qquad (34)$$

Equation (34) when simplified, results in equation (31), as desired.

Figure 10:
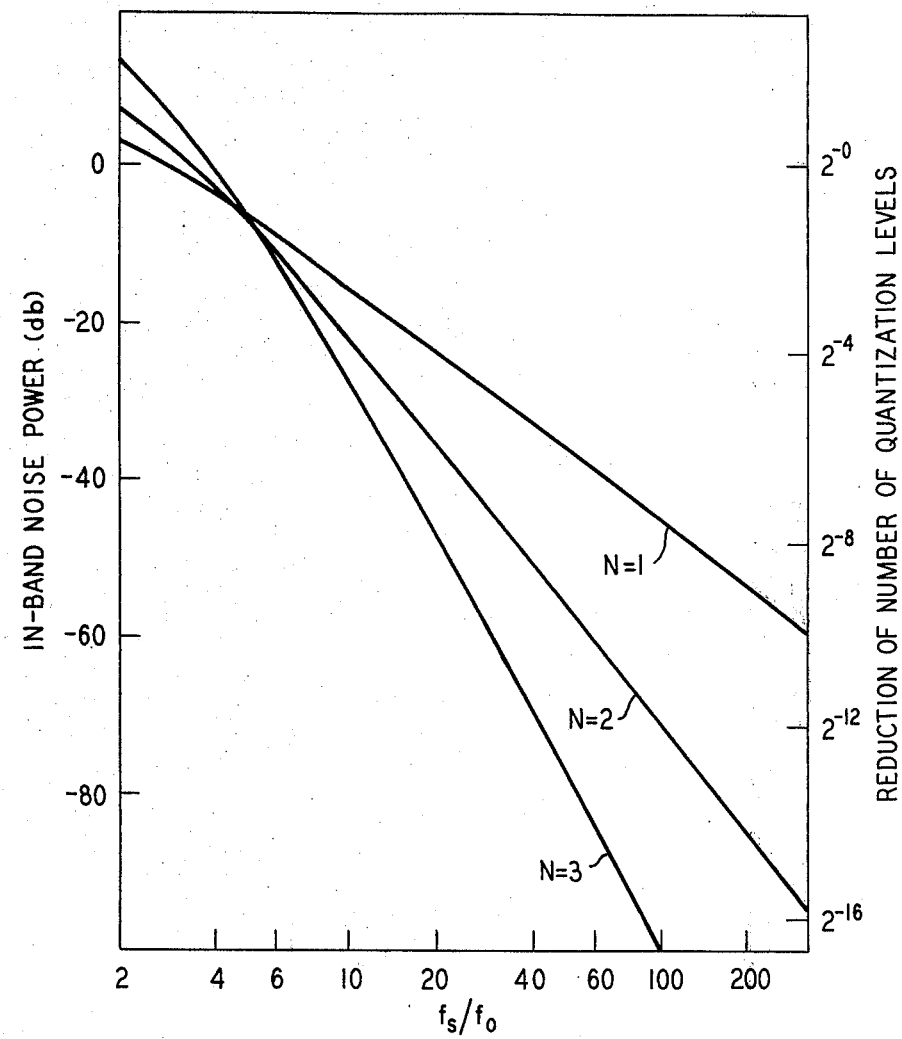
FIG. 10 is a graph showing the reduction in the number of quantization levels achievable using the coder of FIG. 8.

The advantages of the coder of FIG. 8 can be appreciated by reference to FIG. 10, which shows the reduction in the number of quantization levels achievable by use of the present invention. For a sampling rate $f_s$ of 20 times the highest signal frequency $f_o$, and for a three stage integrator, a reduction in the number of levels by a factor of $2^8$ is attained.

While the above descriptions of predictive and error feedback coders indicate that performance improves as the number N of delay line stages (or integrators) increases, this theoretical improvement is limited by experimental implementations which indicate that use of feedback networks in which N>5 is not practical. First, the loop gain G is nominally unity but is bounded, for stability reasons, by $$2^N/(2^N+1) < G < 2^N/(2^N-1) \qquad (35)$$

for an N-tap predictor. Thus, as N gets larger, the stability limits are narrowed. Furthermore, loop delay is added by the nonzero propagation delays of the A/D and D/A converters and must be compensated by, for example, feedforward techniques in the cascaded integrators of FIG. 5. Neglecting such compensation can also lead to coder instability. Therefore, the simplification of the quantizer is offset by an increasing sensitivity of the coder stability to the analog feedback network as N increases.

In addition to increased stability problems as N becomes large, the quantizer input signal power contains a contribution, neglected above, from the nonzero quantizing errors. Letting $\sigma_e^2$ be the mean square power of the predictive coder's difference signal $e_n$, $\sigma_s^2$ be the mean square power of the error feedback coder's input signal power and assuming a uniform level separation $\delta$ in the quantizer (random quantizing errors and noise power $\delta^2/12$), the mean square value $\sigma_{in}^2$ of the quantizer input signal is $$\sigma_{in}^2 = \sigma_e^2 + (\delta^2/12) \cdot \sum_{i=1}^{N} a_i^2 \qquad (36)$$

for predictive coders and $$\sigma_{in}^2 = \sigma_s^2 + (\delta^2/12) \cdot \sum_{i=1}^{N} b_i^2 \qquad (37)$$

for error feedback coders. In predictive coders, $\sigma_e^2$ decreases with N increasing while $\delta_2$ remains fixed, setting a lower limit on $\sigma_{in}^2$ as N increases. With error feedback coders, $\delta$ increases with increasing N while $\sigma_s^2$ remains fixed, again placing a lower limit on $\sigma_{in}^2$.

For these reasons, a practical limit on feedback filter complexity in an oversampled coder realization is likely to be N < 5.

An example of the advantages of the present invention is illustrated by the A/D interface unit which is presently employed to quantize the frequency division multiplexed signals in the digital processor described in Communication Technology, Vol. COM-19, No. 6, December 1971 pp. 1050–59. This unit presently quantizes a 108 KHz bandwidth signal using a 13 bit uniform PCM code. However, utilizing a four stage predictive coder constructed in accordance with the invention, with a 2 MHz sample rate, only an eight-level (3 bit) quantizer is required.

While not shown in the drawing, remote decoding of the outputs of both the predictive and error feedback coders of the present invention is quite simply attained. For predictive encoders, the output/input relationship for the entire coder is given by $$O(Z) = (1-Z^{-1})^N [I(Z) + q(Z)] , \qquad (38)$$

where $O(Z)$ is the output signal, $I(Z)$ is the input signal and $q(Z)$ is the quantizing error. Accordingly, the remote decoder may comprise a serial chain of N integrators, which, as stated previously, has a transfer function given by $1/(1-Z^{-1})^N$. In the case of error feedback encoders, the output/input relationship is given by $$O(Z) = I(Z) + (1-Z^{-1})^N q(Z). \qquad (39)$$

Accordingly, a low pass filter with a stop band chosen to compensate for the increasing noise spectral density at higher frequencies, may conveniently be used for decoding.

Various modifications and adaptations of the present invention will be readily apparent to those skilled in the art. For this reason, it is intended the invention be limited only by the appended claims.

What is claimed is:

1. A differential pulse code modulation encoder for converting an analog input signal to a digital output signal, said output signal representing the difference between said input signal and a decoded version of said output signal, comprising
   a comparator for generating an error signal formed by subtracting said decoded version of said output signal from said input signal,
   quantizing means substantially instantaneously responsive to said comparator for generating said digital output signal by sampling said error signal and converting said samples to digital form, and
   means for generating said decoded version of said output signal characterized by a digital to analog converter for generating an intermediate analog signal in response to said digital output signal, a serial chain of at least three integrators for receiving said intermediate analog signal, and means for summing the outputs of each of said integrators of said chain.

2. The invention defined in claim 1 wherein said analog input signal has a bandwidth $f_o$ and said quantizing means is arranged for sampling at a rate of at least $5 f_o$.

3. The invention defined in claim 1 wherein said digital output signal includes a plurality of bits.

4. In a differential pulse code modulation encoder including means for substantially instantaneously converting an analog input signal into a digital output signal which represents said input signal, a decoder for reconverting said output signal to a good prediction of said input signal, said decoder comprising
   1. first means including a serial chain of M integrators, wherein M $\geq$ 3, for receiving said output signal, and
   2. second means for obtaining the sum of the outputs of each of said integrators of said chain to form said good prediction.

5. The invention defined in claim 4 wherein said first means further includes means for converting said received output signal to an analog signal and wherein said M integrators are analog integrators.

6. The invention defined in claim 5 wherein said analog signal has a bandwidth $f_o$ and said converting means includes a quantizer adapted to sample said analog signal at a rate at least five times greater than $f_o$.

7. The invention defined in claim 4 wherein said digital output signal includes a plurality of bits.

* * * * *